United States Patent
Prammer et al.

(10) Patent No.: US 6,737,864 B2
(45) Date of Patent: May 18, 2004

(54) MAGNETIC RESONANCE FLUID ANALYSIS APPARATUS AND METHOD

(75) Inventors: Manfred G. Prammer, Downington, PA (US); John C. Bouton, Doylestown, PA (US); Peter Masak, West Chester, PA (US)

(73) Assignee: Halliburton Energy Services, Inc., Houston, TX (US)

( * ) Notice: Subject to any disclaimer, the term of this patent is extended or adjusted under 35 U.S.C. 154(b) by 146 days.

(21) Appl. No.: 10/109,072

(22) Filed: Mar. 27, 2002

(65) Prior Publication Data

US 2002/0140425 A1 Oct. 3, 2002

Related U.S. Application Data

(60) Provisional application No. 60/279,324, filed on Mar. 28, 2001.

(51) Int. Cl.[7] .................................................. G01V 3/00
(52) U.S. Cl. .................... 324/303; 324/300; 324/306
(58) Field of Search .......................... 324/303, 306, 324/307, 300, 314, 338, 339; 128/653

(56) References Cited

U.S. PATENT DOCUMENTS 6,046,587 A * 4/2000 King et al. ................. 324/306
6,346,813 B1 * 2/2002 Kleinberg ................... 324/303

* cited by examiner

Primary Examiner—Louis Arana
Assistant Examiner—Brij B. Shrivastav
(74) Attorney, Agent, or Firm—Pennie & Edmonds LLP

(57) ABSTRACT

Apparatus and method for providing in-situ data of formation fluids at true reservoir conditions. The apparatus has NMR chamber of the flow-through type, so it is no longer necessary to divert a sample for the basic NMR analysis or transfer it uphole for laboratory analysis. The apparatus is preferably modular and is compatible with wireline tools configurable for a variety of sampling, testing and monitoring purposes. Fluid properties such as viscosity can be derived from diffusivities and relaxation times, as measured by NMR. Additional accuracy is provided in the downhole sampling process, and in the interpretation of NMR logs in real time at true reservoir conditions.

15 Claims, 12 Drawing Sheets

(NOT TO SCALE)

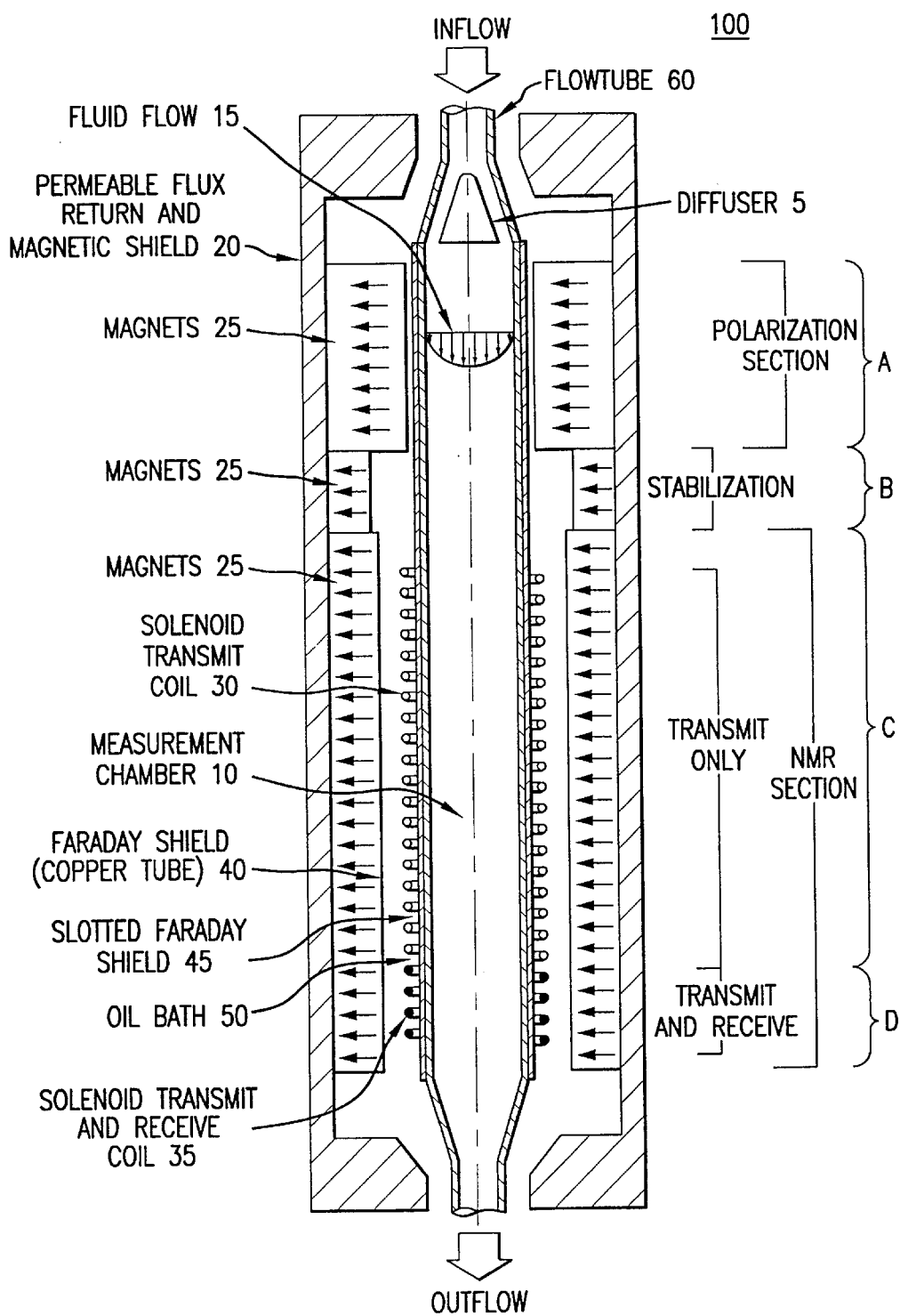
FIG. 1 (NOT TO SCALE)

SYTEM BLOCK DIAGRAM

PULSE DIAGRAM

MAGNETIC RESONANCE FLUID ANALYSIS APPARATUS AND METHOD

This application claims priority of provisional application Ser. No. 60/279,324, filed Mar. 28, 2001. The content of the above application is incorporated herein by reference.

FIELD OF THE INVENTION

The present invention relates generally to downhole fluid analysis and more particularly to a nuclear magnetic resonance (NMR) apparatus and method providing in-situ data about formation fluids at true reservoir conditions.

BACKGROUND OF THE INVENTION

The analysis of downhole fluid samples is desirable in many oil industry applications. In the prior art this it is typically done by bringing samples to the surface using sealed containers, and sending the samples for laboratory measurements. A number of technical and practical limitations are associated with this approach.

The main concern usually is that the sample(s) taken to the surface may not be representative of the downhole geologic formation due to the fact that only limited sample material from a limited number of downhole locations can be extracted and taken to the surface. Thus, taking samples to the surface is impractical if it is desired to measure the fluid on a dense grid of sample points. Therefore, by necessity the measurements will only provide an incomplete picture of the downhole conditions.

In addition, these samples frequently contain highly flammable hydrocarbon mixtures under pressure. Depressurizing the containers frequently leads to the loss of the gas content. Handling of such test samples can be hazardous and costly. Significant practical problems are further caused by fluid phase changes during retrieval and transport, difficulties in re-creating reservoir conditions and, in general, the significant time delay associated with the laboratory analysis.

It is apparent that the above fluid sampling and analysis process ideally would be preceded or even completely replaced by downhole fluid analysis of as many samples as desired, with the final results instantaneously available at the well site. Nuclear magnetic resonance (NMR) technology is well suited for this purpose, as it enables the user to determine many properties of an in-situ formation fluid without extracting numerous samples. These properties include hydrogen density, self-diffusivity, and relaxation times, $T_1$ and $T_2$. NMR devices, methods and pulse sequences for use in logging tools are described, for example, in U.S. Pat. Nos. 4,350,955; 5,557,201; 4,710,713; 4,717,876; 4,717,877; 4,717,878; 5,212,447; 5,280,243; 5,309,098; 5,412,320; 5,517,115; 5,557,200; 5,696,448; 5,936,405; 6,005,389;6,023,164 and 6,051,973. The above patents are hereby incorporated by reference.

Direct downhole measurement of certain fluid properties is known in the art. Several commercially available tools can be used to this end. Examples include the RDT™ tool manufactured by Halliburton, the Reservoir Characterization Instrument (RCI™) from Western Atlas, and the Modular Formation Dynamics Tester (MDT™) made by Schlumberger. These tester tools have modular design that allows them to be reconfigured at the well site. Typically, these tools provide pressure-volume measurements, which can be used to differentiate liquids from gases, and are also capable of providing temperature, resistivity and other mechanical or electrical measurements. However, these tools do not generally provide NMR measurements, as discussed above.

The use of NMR measurements to determine downhole formation fluid properties is also known in the field. The first approach to this end is disclosed in U.S. Pat. No. 6,111,408 to one of the inventors of the present invention, which discloses a method and apparatus for making direct downhole NMR measurements of formation fluids. The disclosure of this patent is incorporated by reference for all purposes. The device in the '408 patent, however, generally requires that a portion of the fluid be diverted from the main flow line and be held stationary for the duration of the measurement, which may take about a minute. A possible concern about such use of this device is the occurrence of fluid phase separation due to the diversion from the main flow line and separation due to gravity once the sample has been stagnated. In addition, depending on relative concentrations, the sample chamber may contain only a subset of the phases contained in the flow line.

Accordingly, it is perceived that there is a need for a tester capable of performing direct, continuous-flow downhole NMR measurements that can be used to enhance the quality and reliability of formation evaluation obtained using prior art techniques. Additionally, there is a need to provide a modular NMR downhole analysis apparatus that can be used as an add-on to existing testing equipment so as to minimize the cost of the extra measurements.

In order to more fully appreciate why NMR is important in measurements of this type, the reader is directed to Stokes' equation:

$$D \propto kT/\eta, (k=1.38 \times 10^{-23} J/K) \tag{1}$$

Eq. (1) essentially indicates that the self-diffusion coefficient D is inversely proportional to viscosity $\eta$ and vice versa. Viscosity and diffusivity are both related to the translational motion of molecules and therefore must be interrelated. At higher temperatures T, a molecule contains more energy and can move faster against a given "friction" $\eta$, therefore $D \propto T$. Diffusivity is a property that can be precisely determined by NMR techniques without disturbing or altering the fluid. The relationship $D \propto T/\eta$ has been verified over a wide range of viscosities at different temperatures and pressures by NMR spin-echo experiments. Referring to the prior art references listed below, see, for example, Abragam, 1961.

One has to be more careful with relationships involving the NMR relaxation times $T_1$ and $T_2$. The applicability of expressions of the form, $$T_1, T_2 \propto kT/\eta, \tag{2}$$

is more limited than that of Eq. (1). The main reason is that gas/liquid mixtures, such as live oils, relax by more than one relaxation mechanism: dipole-dipole for the liquid phase and mainly spin rotation for the gas phase. In combination, however, NMR relaxometry (measuring $T_{1\ and\ T2}$) and NMR diffusometry (determining D) are powerful tools to characterize live oils.

With further reference to the prior art list below, the study of NMR relaxation times with respect to oil properties began shortly after NMR was first demonstrated (Bloembergen et al., 1948; Brown, 1961). The practical aspects of how to relate $T_1$, $T_2$ and D to petrophysical fluid properties such as viscosity and gas/oil ratio have attracted interest much more recently (Kleinberg et al., 1996; Lo et al., 1998; Zhang et al., 1998; Appel et al., 2000; Lo et al., 2000). These investigations are significant because NMR relaxometry can be performed at much lower field strengths and with much lower homogeneity requirements than NMR spectroscopy (1,000 ppm v. <1 ppm). The latter seems to be out of reach for downhole applications, but the development of a robust and accurate NMR relaxometry/diffusometry system for downhole use proved to be feasible.

Another favorable factor was the development of the Reservoir Description Tool of Halliburton (RDT; Proett et al., 1999), which is a modular wireline sampling and testing system that can be configured in a variety of tool combinations and can readily accept add-on analysis devices. Advantageously, these tools generally can operate independently of each other. The inclusion of an NMR fluid analyzer in the RDT tool string has the following benefits:

(1) The level of fluid contamination due to, for example, filtrates from water or oil based muds can be assessed continuously by observing the fluid's $T_1$ relaxation time distribution.

(2) Estimates for fluid viscosity and gas/oil ratio (GOR) can be estimated in real time. Viscosity can be derived from either $T_1$ or D, and GOR from a combination of both parameters.

(3) The NMR analysis takes place at true reservoir conditions, removing ambiguities associated with sampling and transport procedures.

(4) The shared measurement principles behind wireline NMR tools and the downhole NMR fluid analyzer encourage the development of integrated formation evaluation methods.

(5) Data from the NMR analysis are processed downhole and the results are viewable in real time. This information can be useful in the selection of further sampling points and for the fine-tuning an open-hole logging program. A simple example of this synergy is the verification of the hydrogen density in the invaded zone by in-situ fluid testing, a number which feeds directly into the porosity reading of both wireline and logging-while-drilling (LWD) tools.

Details of the apparatus and method in accordance with the present invention are provided below. The interested reader is directed for additional background information to the disclosure of the following references, which are incorporated herein by reference for background. For simplicity, in the following disclosure only the first author and date of publication are provided.

1. Abragam, A., 1961, *Principles of Nuclear Magnetism*, Oxford University Press, Oxford.
2. Appel, M., Freeman, J. J., Perkins, R. B., and van Diik, N. P., 2000, Reservoir Fluid Study by Nuclear Magnetic Resonance, Paper HH: SPWLA, presented at the 41st Annual Logging Symposium, Dallas, Tex., June 4–7.
3. Bloembergen, N., Purcell, E. M., and Pound, R. V., 1948, *Phys. Rev.* 73, p. 679.
4. Brown, R. J. S., 1961, Proton Relaxation in Crude Oils, *Nature* 189, no. 4762, p. 387.
5. Coates, G. R., Xiao, L., and Prammer, M. G., 1999, NMR Logging, Principles and Applications, Halliburton Energy Services, Houston.
6. Freedman, R., Sezginer, A., Flaum, M., Matteson, A., Lo, S., and Hirasaki, G. J., 2000, A New NMR Method of Fluid Characterization in Reservoir Rocks: Experimental Confirmation and Simulation Results, Paper SPE-63214: Society of Petroleum Engineers, presented at the 75th Annual Technical Conference and Exhibition, Dallas, Tex., October 1–4.
7. Kimmich, R., 1997, *NMR Tomography, Diffusometry, Relaxometry*, Springer-Verlag, Berlin.
8. Kleinberg, R. L., and Vinegar, H. J., 1996, NMR Properties of Reservoir Fluids, *The Log Analyst*, November–December, p. 20.
9. Lo, S.-W., Hirasaki, Kobayashi, R., and House, W. V., 1998, Relaxation Time and Diffusion Measurements of Methane and n-Decane Mixtures, *The Log Analyst*, November-December, p.43.
10. Lo, S.-W., Hirasaki, G., House, W. V., and Kobayashi, R., 2000, Correlations of NMR Relaxation Times with Viscosity, Diffusivity, and Gas/Oil Ratio of Methane/Hydrocarbon Mixtures, Paper SPE-63217: Society of Petroleum Engineers, presented at the 75th Annual Technical Conference and Exhibition, Dallas, Tex., October 1–4.
11. Prammer, M. G., 1994, NMR Pore Size Distributions and Permeability at the Well Site, Paper SPE-28368: Society of Petroleum Engineers, presented at the 69th Annual Technical Conference and Exhibition, New Orleans, La., September 25–28.
12. Prammer, M. G., Mardon, D., Coates, G. R., and Miller, M. N, 1995, Lithology-Independent Gas Detection by Gradient-NMR Logging, Paper SPE-30562: Society of Petroleum Engineers, presented at 70th Annual Technical Conference and Exhibition, Dallas, Tex., Oct. 22–25.
13. Prammer, M. G., Bouton, J., Chandler, R. N., Drack, E. D., and Miller, M. N., 1998, A New Multiband Generation of NMR Logging Tools, Paper SPE-49011: Society of Petroleum Engineers, presented at the 73rd Annual Technical Conference and Exhibition, New Orleans, La., September 27–30.
14. Prammer, M. G., Drack, E., Goodman, G., Masak, P., Menger, S., Morys, M., Zannoni, S., Suddarth, B., and Dudley, J., 2000, The Magnetic Resonance While-Drilling Tool: Theory and Operation, Paper SPE-62981: Society of Petroleum Engineers, presented at the 75th Annual Technical Conference and Exhibition, Dallas, Tex., October 1–4.
15. Prammer, 2000, Method and apparatus for differentiating oil based mud filtrate from connate oil, U.S. Pat. No. 6,107,796, August 22.
16. Proett, M. A., Gilbert, G. N., Chin, W. C., and Monroe, M. L., 1999, New Wireline Formation Testing Tool with Advanced Sampling Technology, Paper SPE-56711, Society of Petroleum Engineers, presented at the 74th Annual Technical Conference and Exhibition, Houston, Tex., October 3–6.
17. Van Dusen, A., Williams, S., Fadnes, F. H., and Irvine-Fortescue, J., 2000, Determination of Hydrocarbon Properties by Optical Analysis During Wireline Fluid Sampling, Paper SPE-63252: Society of Petroleum Engineers, presented at the 75th Annual Technical Conference and Exhibition, Dallas, Tex., October 1–4.
18. Zhang, Q., Lo, S., Huang, C. C., Hirasaki, G. J., Kobayashi, R., and House, W. V., 1998, Some Exceptions to Default NMR Rock and Fluid Properties, Paper FF: SPWLA, presented at the 39th Annual Logging Symposium, Keystone, Colo., May 26–29.

SUMMARY OF THE INVENTION

The NMR analyzer apparatus and method of the present invention provides in-situ data of formation fluids at true reservoir conditions and overcome the above-identified and other problems associated with the prior art.

In one aspect, the present invention is a method for analyzing formation fluids in a borehole environment, comprising the steps of: (a) introducing formation fluids in a flow-through vessel located in the borehole; (b) generating a substantially uniform static magnetic field in the vessel with a defined magnetic field direction; (c) generating pulsed oscillating magnetic fields for exciting nuclei of formation fluids in a first portion of the vessel, said oscillating fields having a magnetic direction substantially perpendicular to the direction of the static magnetic field; (d) receiving nuclear magnetic resonance (NMR) relaxation signals from excited nuclei of the fluid in a second portion of the vessel, smaller than the first portion; and (e) analyzing the received signals to determine fluid properties at any flow rate of the formation fluids in the vessel below a predetermined non-zero threshold. In a specific embodiment, the pulsed magnetic fields used are according to a saturation recovery pulse sequence. In various other specific embodiments, the threshold value for the flow rate is determined by the length of the first portion, the second portion of the vessel is positioned downstream from the first portion of the vessel, and the first and second portions of the vessel overlap at least in part. In a specific application, the steps of the method are performed substantially continuously, and the step of analyzing comprises assessing mud filtrate contamination for the formation fluids. Additionally, the step of analyzing may comprise monitoring the $T_1$ profile of fluids passed through the vessel.

In another aspect, the present invention is a method for analyzing fluids, comprising the steps of: (a) providing a flow-through passage for fluids in a measurement chamber, the fluids having flow rate within a pre-determined range; (b) performing a NMR experiment to excite substantially all nuclei of the fluids in the chamber at a given time interval; and (c) processing NMR signals obtained from a portion of the chamber in said experiment without regard for the flow rate of the fluids in the chamber. Various specific embodiments are disclosed in detail next.

In another aspect, the present invention is an apparatus for analyzing downhole formation fluids, comprising: (a) a conduit for introducing formation fluids into the apparatus and for providing flow-through passage, the conduit having an inlet end and an outlet end; (b) at least one magnet assembly enclosing the conduit for generating in the conduit a substantially uniform static magnetic field with a defined magnetic field direction; (c) at least one transmitting antenna operative to generate pulsed magnetic fields in the conduit in a direction substantially perpendicular to the static field direction for exciting nuclei of fluids contained in the conduit; and (d) at least one receiving antenna operative to receive NMR signals from fluids in a portion of the conduit, the receiving antenna being shorter than the at least one transmitting coil, so that received NMR signals correspond only to a portion of the excited nuclei. The apparatus of this aspect may further comprise a shield mounted between the transmitting antenna and a portion of the magnet assembly. In various specific embodiments, the apparatus may have a portion of the conduit between the inlet and outlet ends be wider in dimension than the conduit at either end, and further have a diffuser positioned near the inlet end of the conduit, for providing consistent fluid flow velocity over the wider portion of the conduit. In a preferred embodiment, the conduit is adapted for attachment to the flow line of a modular wireline logging tool. Additionally, the at least one magnet assembly in a preferred embodiment has a polarization portion located near the inlet end, and a resonance portion located near the outlet end, the strength of the magnetic field in the polarization portion being higher than the strength of the magnetic field in the resonance portion. Other features of the preferred embodiments are disclosed in more detail next.

In a further aspect, the present invention is a tester module for use with modular downhole formation testers for downhole NMR testing of formation fluids comprising: a vessel for providing flow-through passage of formation fluids and for conducting downhole NMR measurements, said vessel being adapted to withstand borehole environment conditions; at least one tubular magnet defining a longitudinal axis, the magnet having magnet sections with magnetization direction(s) perpendicular to the longitudinal axis, and enclosing the passage to generate therein a static magnetic field with predetermined magnetic field direction; at least one radio frequency (RF) transmitter operative to generate pulsed RF magnetic fields in a first portion of the passage in a direction substantially perpendicular to the static field direction for exciting nuclei of fluids in the passage; a receiver for acquiring NMR signals from excited nuclei in a second portion of the passage smaller than the first portion and positioned downstream therefrom, and a processor for analyzing properties of fluids in the passage based on signals from the receiver.

In yet another aspect, the present invention is a n apparatus for downhole differentiating between fluid types present in a geologic formation comprising: (a) a measurement chamber having flow-through passage for formation fluids; (b) an NMR testing module capable of performing an NMR experiment on a portion of the formation fluid within the passage, the experiment exciting nuclei of the formation fluids in the passage at a given time interval; and (c) processor receiving NMR signals obtained in said testing module to differentiate fluid types in the formation fluids without regard for the flow rate of the formation fluids in the passage.

Various specific features of the preferred embodiments are disclosed in detail below and are defined in the appended claims.

BRIEF DESCRIPTION OF THE DRAWINGS

FIG. 1 is a schematic diagram of a downhole NMR fluid analyzer in accordance with a preferred embodiment of the present invention.

DETAILED DESCRIPTION OF THE PREFERRED EMBODIMENTS

The Apparatus

Figure 1A:
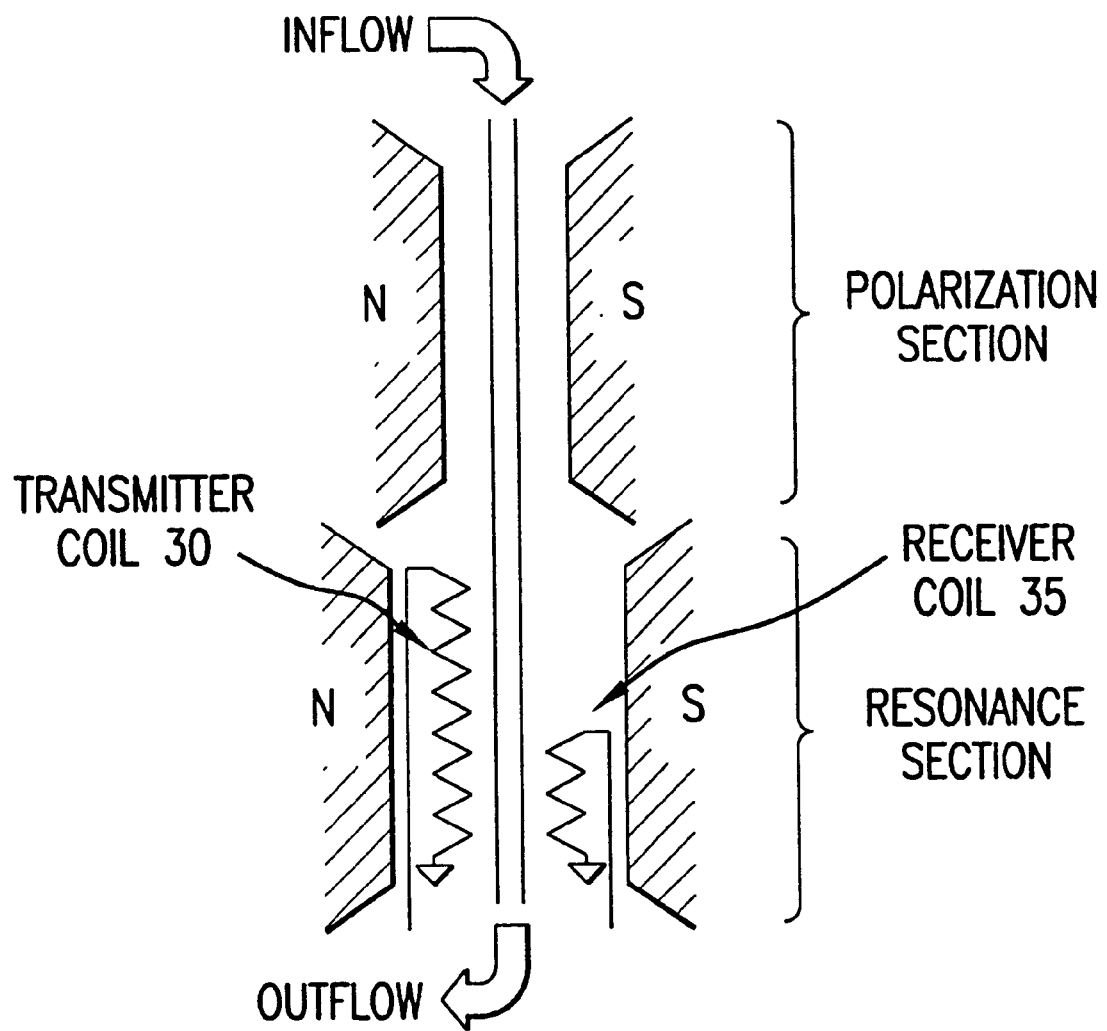
FIG. 1A is a simplified diagram.

FIG. 1 shows a schematic diagram of a fluid analysis apparatus 100 used in accordance with a preferred embodiment of the present invention. A simplified diagram of the analysis apparatus of the invention is shown in FIG. 1A. The apparatus of this invention is advantageously designed as a module for use with a logging tool, such as for example the RDT™ tool string by Halliburton Energy Services Corporation, which tool is configurable for a variety of sampling, testing and monitoring purposes.

As shown, fluids enter the device at the top and pass through two sections, referred to as polarization and resonance sections, respectively. Measurements are performed as the fluid flow 15 passes through the device. The fluid entering the system is initially subjected to a strong magnetic field to achieve rapid polarization of the hydrogen nuclei. NMR measurements take place in the lower section, where the field strength is lowered. In a preferred embodiment, two separate radio frequency coils are used for pulse transmission and for reception. This split scheme allows for a transmitter coil 30 that is longer than the receiver 35. In accordance with this invention, by pulsing a larger volume of fluid and by receiving only from the bottom portion, relaxation times can be determined without regard for the actual flow rate.

More specifically, with reference to FIG. 1, the fluid to be analyzed flows into the measurement chamber 10, which is widened to a diameter of approximately 2 cm in a specific embodiment. The increase in diameter (compared to a standard 0.2 inch—i.e., 0.508 cm—flow tube diameter) serves two purposes: it increases the available volume and NMR signal amplitude and it slows down the fluid, which allows to shorten the length of the fluid analyzer apparatus. In a specific embodiment, the incoming fluids encounter a conical diffuser 5 that breaks the typical plume-like flow pattern which develops when a narrow flow channel widens into a larger volume. The result is a more consistent flow velocity over the entire cross section of the measurement volume. The length of the analysis apparatus is dictated by the requirement for sufficient polarization time at various possible pump-out rates, and in a preferred embodiment is about 1 meter.

In alternative embodiments the measurement volume may be filled with collimators, i.e., thin tubes, the goal being to slow down the fluid as much as possible across the entire cross section, while maintaining the initial flow conditions.

In a specific embodiment, fluids can be pressurized to up to 25,000 psi, although higher or lower pressure values can be used in alternative implementations. Under such high pressure conditions, there must be outside counter-pressure, which in the above specific embodiment is selected to be about 20,000 psi, so that the structure is designed to absorb a differential pressure of about 5,000 psi. Most of this differential pressure is absorbed in a steel hull (not shown), serving as a pressure barrel that in a preferred embodiment has connectors on each end that mate to a tool string, for example of the RDT tool. Preferably, inside components of the device are either solid (magnetic elements) or are potted in solid compounds to allow the pressure to pass through and not to damage any components.

As shown in FIG. 1, in a preferred embodiment there are four main sections of the analyzer apparatus, labeled (A) through (D). Sections (A) and (B), which occupy the top portion of the instrument are required to rapidly polarize and then stabilize the nuclear magnetic moment. The equilibrium magnetization of the device in this embodiment corresponds to an applied field of 1,000 Gauss, although up to about 2,500 Gauss can be applied in section (A) in order to achieve very fast polarization. The NMR measurement takes place in sections (C) and (D), where section (C) is longer than D. In the specific embodiment, section (C) is about two-three times the length of section (D). As noted, the radio frequency coil of the device is preferably split into a transmit-only portion (C) and a transmit/receive portion (D). In accordance with the invention, it is important that the fluid flows from section (C) into (D) and not vice versa, because otherwise measurements would be inaccurate. Thus, excitation pulses are applied to the entire resonating volume (C)+(D), while reception is only made from section (D). As described in further detail below, the nature of a saturation-recovery $T_1$ experiment, used in accordance with a preferred embodiment of the method, is that a single pulse can be used to prepare a large volume, while the actual readout may happen over a smaller volume. In the present invention, this feature is used to render the measurement of $T_1$ relaxation times largely independent of flow velocities, up to a certain practical limit. The RF antennas in a preferred embodiment are wound bifilar, where the transmit coil is longer, extending throughout regions (C) and (D). In a specific embodiment, transmission and reception both operate at 4.258 MHZ at room temperature, consistent with 1,000 Gauss field strength. At higher temperatures, the operating frequency is reduced to track the reversible reduction in magnetic field strength.

As further shown in FIG. 1, the analysis apparatus may also have a permeable flux return and magnetic shield 20, magnets in configurations discussed in detail below, Faraday shields 40 and 45 and oil bath 50. Preferably, in close proximity can be placed one or more temperature sensors (not shown) that track the magnets' temperature for frequency adjustment and the sample's temperature for viscosity calculations. As described next, using the apparatus illustrated in FIG. 1 it is possible to determine hydrogen density, relaxation times and self-diffusivity without altering the fluid.

The magnetic field in the measurement volume of the device shown in FIG. 1 in general is not entirely uniform. This volume can be split conceptually into an interior region, where the field gradient is negligible, and a fringe region, where the field changes with an approximately uniform gradient. The fringe region may comprise about one third of the total sensitive volume. During $T_1$ measurements and at short pulse-to-pulse spacings (such as 0.25 ms), the effect of the gradient is not noticeable. To perform a diffusion measurement, in accordance with a preferred embodiment the main flow is diverted and a sample is stagnated within the NMR chamber. Furthermore, the pulse-to-pulse spacing ($T_e$) is increased to induce diffusion-dependent signal dephasing. The uniform and the fringe regions are large compared to the largest possible diffusion length, therefore, these regions are essentially isolated from each other for the duration of a single pulse-echo train.

Figure 2A:
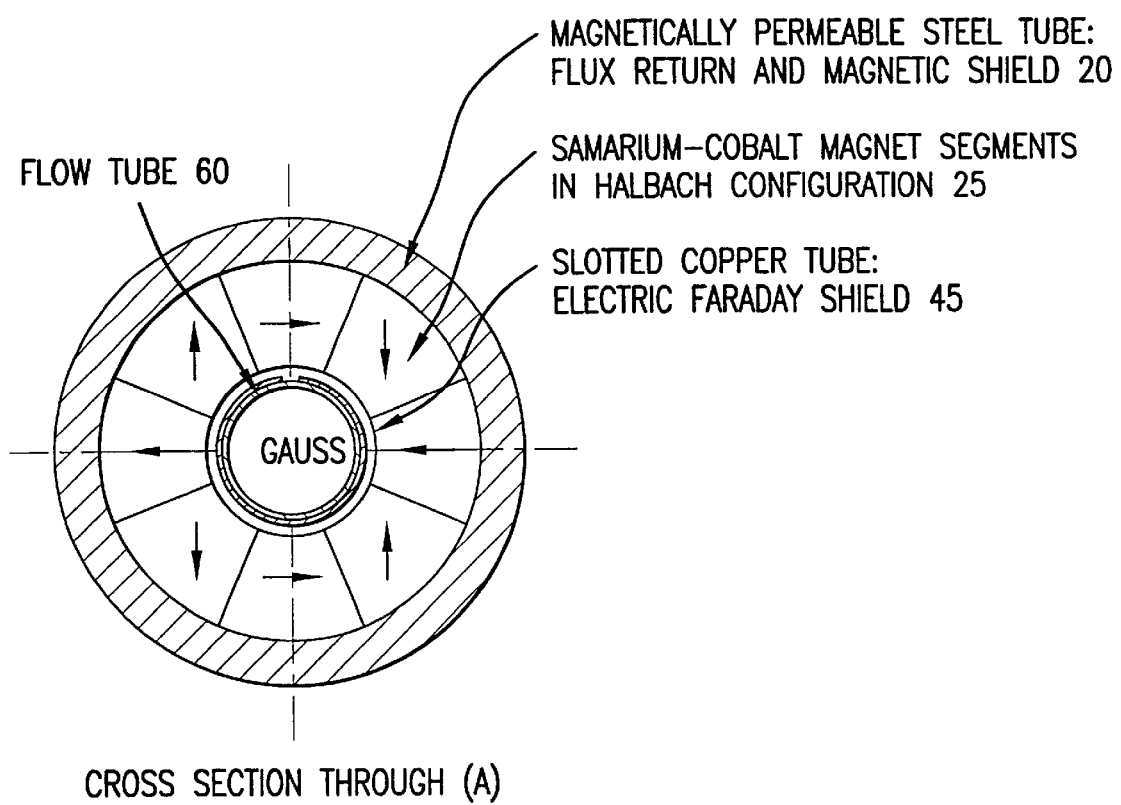
FIGS. 2A–D illustrate horizontal cross-sections of the apparatus shown in FIG. 1.

FIG. 2A is a cross-sectional view of the first section A of the apparatus that the flowing fluid encounters after it enters the measurement chamber. The purpose of this pre-polarization section is to polarize hydrogen nuclei in the fluid(s) as rapidly as possible, so that they will exhibit full polarization under the operating field. The flow tube 60, is made from ceramic, glass or PEEK material, and is surrounded by a Faraday shield 45. This shield consists in a preferred embodiment of a copper cylinder tube, slotted vertically along its axis. In a preferred embodiment, the magnet consists of eight segments 25 that are magnetized as indicated by the arrows in FIG. 2A. The magnet material is preferably Samarium-Cobalt with very low temperature coefficient. A supplier for this material is Electron Energy Corp., Lancaster, Pa. This magnet configuration is known as the "Halbach" configuration, which produces a highly uniform and strong field in the interior. The magnet is dimensioned to produce a field of about 2,000–2,500 Gauss within the flow tube 60. The exact value is not critical and may vary by several hundred Gauss. This magnet is encased in a magnetically permeable steel tube that acts as magnetic shield and confines the field to the inside of the apparatus.

Figure 2B:
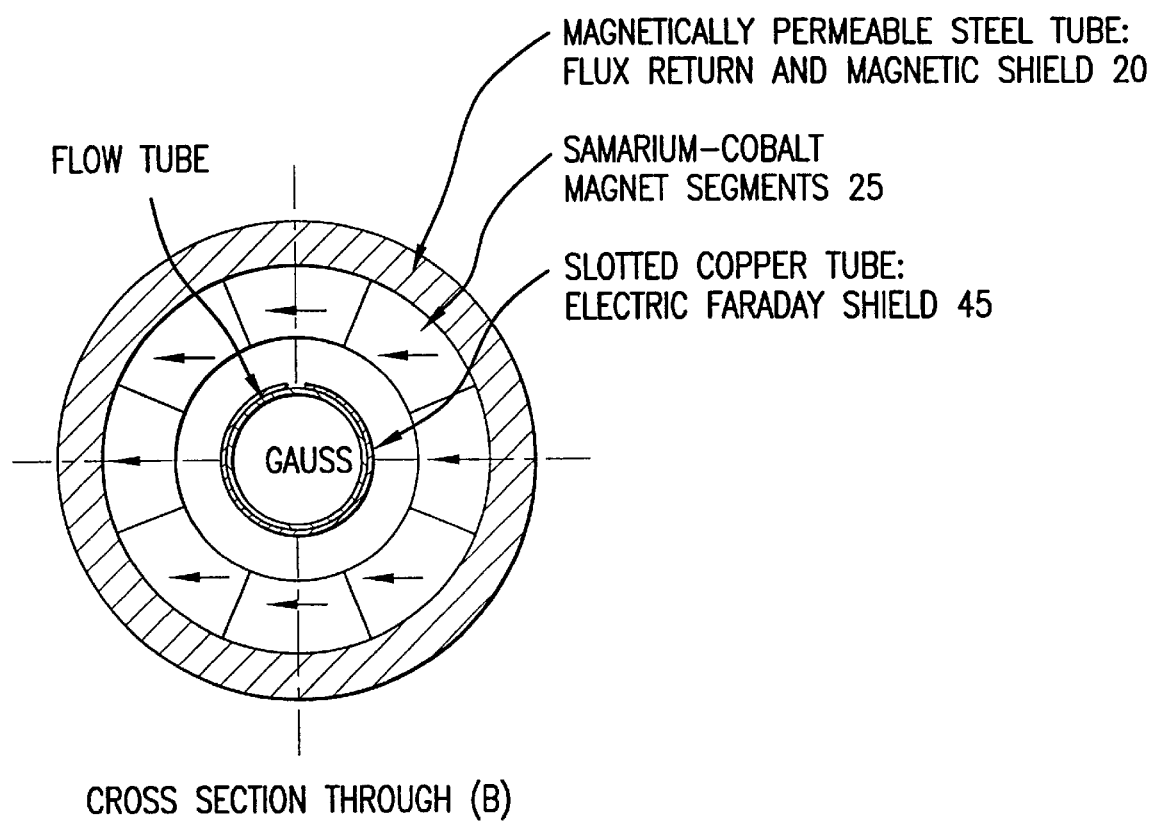

FIG. 2B is a cross-sectional view of the second section (B) of the apparatus, which is located between the polarization section (A) and the measurement sections (C) and (D). The purpose of section (B) is to allow the hydrogen spins to settle to an equilibrium polarization that is close to a non-flowing magnetization corresponding to an external field of 1,000 Gauss. Without this section it would be possible that overpolarized fluids may enter the measurement section below and cause a distortion in the NMR amplitude that is dependent on the flow rate. In a preferred embodiment, the transversal magnetic field generated in the flow tube is approximately 850 Gauss, but again the exact value is not critical and can be varied in practical implementations. As shown, all magnet elements of this section are magnetized in the same direction, resulting in a weaker field than that in section (A).

Figure 2C:
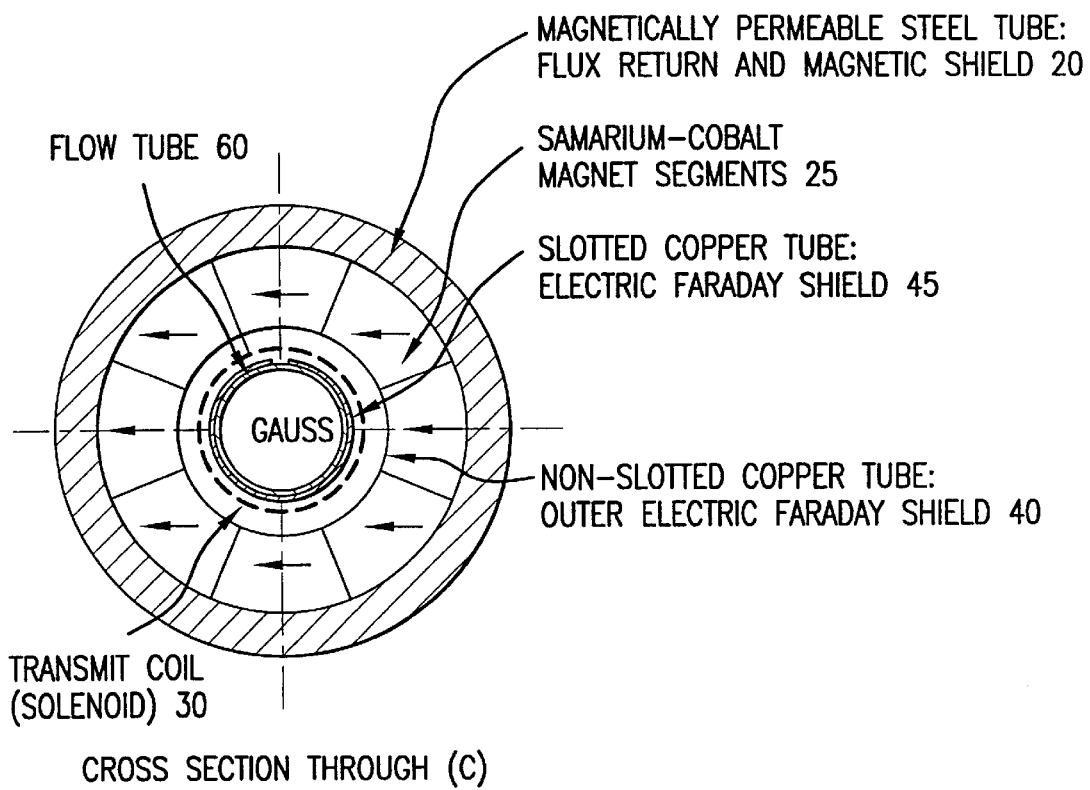

FIG. 2C is a cross-sectional view of the third section (C) of the apparatus. This is the transmit-only section that follows the stabilization section (B). In a preferred embodiment, the transversal magnetic field is about 1,000 Gauss, accurate to +/−10 Gauss, corresponding to a hydrogen NMR resonance frequency of 4.26 MHz. A solenoidal coil 30 wound around the measurement volume generates an RF field of that frequency in longitudinal direction (out of the paper plane). The solenoid is electrically shielded against the fluid by a slotted copper tube 45. This tube terminates any electric field emanating from the coil. The shield allows magnetic flux to pass through as long as there is at least one slot running from top to bottom parallel to the longitudinal axis. A second shield in the form of a second copper tube 40 is mounted between the solenoid and the magnet elements. This shield is not slotted, because it needs to pass only a static magnetic field. All dynamic electromagnetic fields are terminated at this shield as well as any interference or noise from the outside. Any fluid(s) within this section typically are fully polarized corresponding to the working field of 1,000 Gauss. The application of a frequency-swept pulse that covers the frequency range corresponding to fields from 990 to 1010 Gauss saturates the nuclear magnetization. In accordance with the present invention the subsequent built-up towards the equilibrium condition can be monitored in section (D) of the apparatus.

Figure 2D:
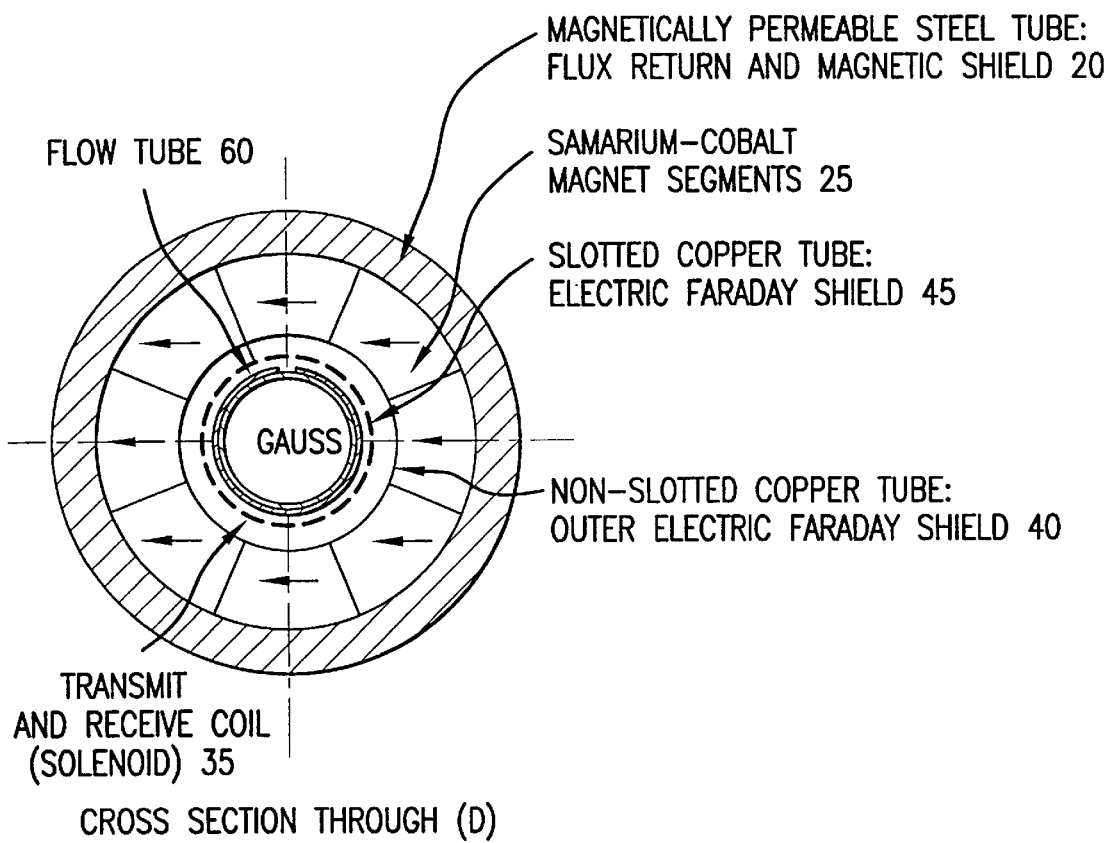

FIG. 2D is a cross-sectional view of the last section (D) of the apparatus 100. This is the transmit/receive section of the device. In a preferred embodiment, the transversal magnetic field is 1,000 Gauss, accurate to +/−1 Gauss, corresponding to a hydrogen NMR resonance frequency of 4.26 MHz. A solenoidal coil 35 wound around the measurement volume generates an RF field of that frequency in longitudinal direction (out of the paper plane) and also receives induced NMR signals from the measurement volume. The two Faraday shields are identical to those in section (C). The NMR time constants $T_1$ of the fluid(s) under investigation are determined by varying the delay time between a broadband saturation pulse and a read-out sequence. If the flow velocity does not exceed 10 cm/s, the measurement is generally independent of the flow speed and of the flow profile.

In manufacturing this magnet system, a large number of segments is produced, magnetized and their actual magnetic remanence Br is measured. The best-matching segments are preferably used to build up section (D), such that the field variations are as small as possible, preferably not to exceed 0.1%. Segments with inferior match are used for section (C), where the accuracy requirement is reduced to about 1%. The magnetic elements for sections (A) and (B) have different dimensions and are uncritical in their magnetic remanence.

Figure 3:
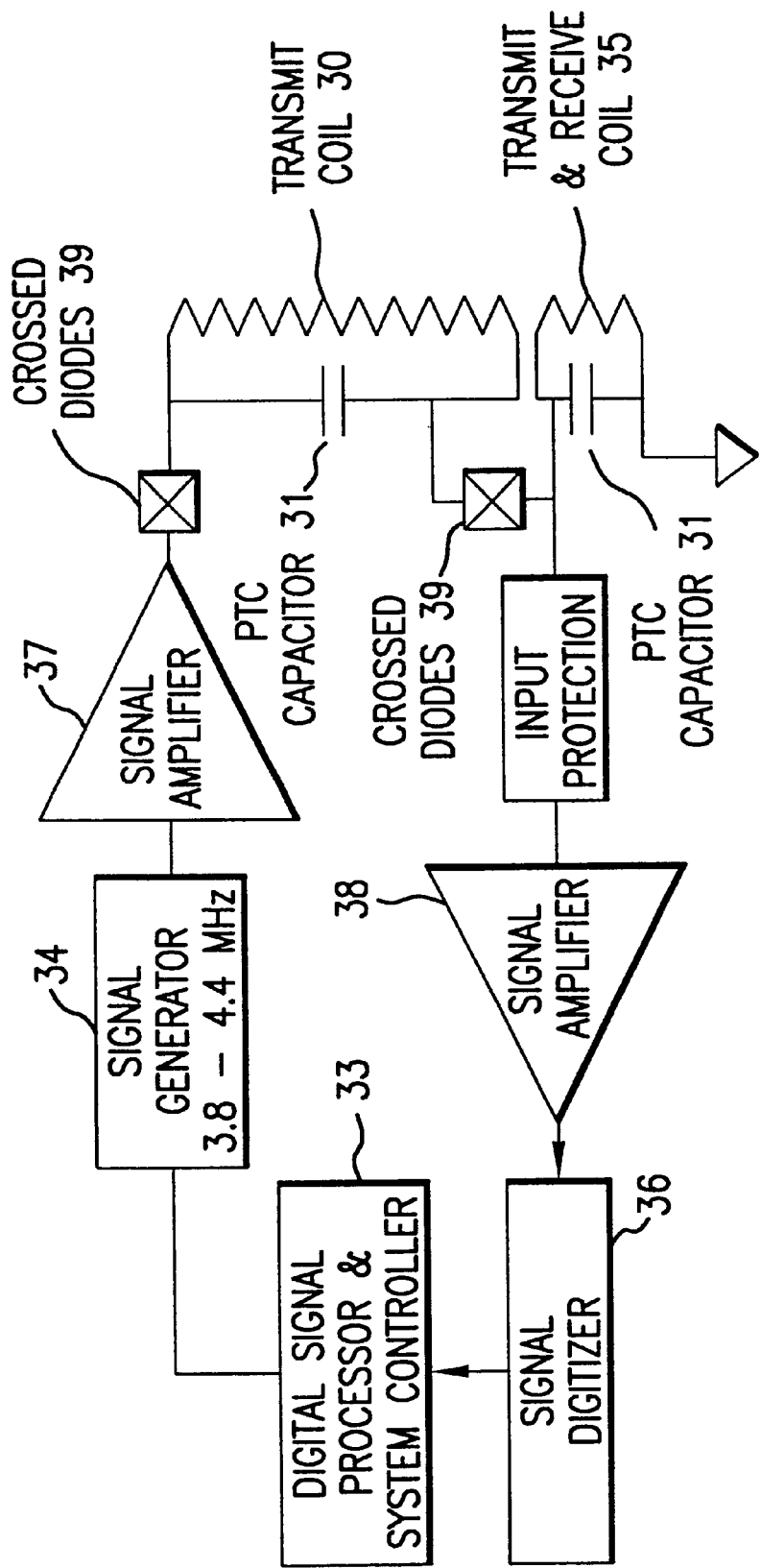
FIG. 3 illustrates a schematic block diagram of the electronics used in accordance with one embodiment of the present invention.

The electronics used in the analysis apparatus of the present invention is similar to that of a NMR spectrometer and is illustrated in a block diagram form in FIG. 3. The comparatively low frequency of 4.2 MHz used in a preferred embodiment of the invention allows many traditionally analog functions to be realized readily as digital signal processing (DSP) algorithms. A frequency source 34, controlled by a pulse programmer, sends its signal to a power amplifier 37, which in turn drives the transmitter antenna 30. All timing functions, like pulse widths and acquisition windows, are fully programmable. On the receive side, the signal from the receiver antenna 35 is amplified, synchronously demodulated and integrated. In a preferred embodiment the system also performs its own calibration. All pertinent calibration factors are stored in the tool itself and after calibration echo amplitudes are reported on a scale of 0–2.

More specifically, as shown in FIG. 3, the two coils of the device 30, 35 are connected to resonating capacitors 31. These capacitors are of the NPO (no temperature coefficient) and PTC type (positive temperature coefficient), shunted in parallel, as shown. The resultant temperature characteristic is such that with increasing temperature, when the static magnetic field weakens (typically 1% per 100° C.), the capacitance increases at twice the rate (typically 2% per 100° C.). The resultant LC circuit resonant frequency drops at half the capacitor rate (1% per 100° C.) and therefore follows the NMR resonance, making re-tuning of the circuit unnecessary.

In a transmit mode, the controller 33 gates the signal generator 34 of the apparatus and the power amplifier 37 to produce a radio frequency pulse in both coils. The high voltage applied causes all crossed diodes 39 to conduct, thereby connecting the two coils. In receive mode, the crossed diodes stop conducting and signal is only received from the lower coil 35. The signal is amplified, digitized and fed into the digital signal processor 33 for demodulation and further processing.

Measurements

A. Understanding NMR Relaxation Times

NMR measurements are based on the observation that when an assembly of magnetic moments, such as those of hydrogen nuclei, are exposed to a static magnetic field they tend to align along the direction of the magnetic field, resulting in bulk magnetization. The rate at which equilibrium is established in such bulk magnetization upon provision of a static magnetic field is characterized by the parameter $T_1$, known as the spin-lattice relaxation time. The spin-lattice relaxation time $T_1$ describes the coupling of nuclear spins to energy-absorbing molecular motions like rotation, vibration and translation. In most fluids at or above ambient temperatures, the coupling to these modes is very inefficient, resulting in $T_1$'s in the millisecond and second range.

Another related and frequently used NMR parameter is the spin-spin relaxation time constant $T_2$ (also known as transverse relaxation time), which is an expression of the relaxation due to non-homogeneities in the local magnetic field over the sensing volume of the logging tool. The mechanisms for spin-spin relaxation time $T_2$ include, in addition to those contributing to $T_1$, the exchange of energy between spins. These effects are small in bulk fluids and therefore $T_2$ basically equals $T_1$. Spin-spin coupling is relevant in heavy oil components, such as asphaltenes, resins, etc. Both relaxation times provide indirect information about the formation porosity, the composition and quantity of the formation fluid, and others.

Another measurement parameter used in NMR is the formation diffusivity. Generally, diffusion refers to the motion of atoms in a gaseous or liquid state due to their thermal energy. Self-diffusion of a fluid is directly related to the viscosity of the fluid, a parameter of considerable importance in borehole surveys. In a uniform magnetic field, diffusion has little effect on the decay rate of the measured NMR echoes. In a gradient magnetic field, however, diffusion causes atoms to move from their original positions to new ones, which also causes these atoms to acquire different phase shifts compared to atoms that did not move. This contributes to a faster rate of relaxation.

Expressions for $T_1$ in closed form have been derived only for spherical molecules. This is obviously a poor approximation to chain-type hydrocarbon molecules, but should serve as illustration for the underlying mechanisms. Translational and rotational relaxation rates are, respectively:

$$1/T_1(\text{translational}) \propto N\eta/kT, \quad (3)$$

$$1/T_1(\text{rotational}) \propto (a^3/b^6)\eta/kT. \quad (4)$$

where N is the spin density of the fluid (proportional to the hydrogen index $I_H$), a is the molecular radius and b is the distance between hydrogen spins on the same molecule. Both mechanisms have the same basic relationship with viscosity and temperature, which explains the relative simplicity of Eq. (2).

Pressure exerts its effect by changing fluid density. Pure liquids are barely compressible and the effect pressure has on them is limited. Downhole pressures over 10,000 psi can induce significant changes in fluid viscosity (Jones, 1991). As a rule-of-thumb, high pressures and high temperatures have opposing effects. Higher temperatures expand fluids and increase mobility and relaxation times, while increased pressures reduce mobility and relaxation times in liquids.

Probably the biggest effect downhole high pressures have is the increase in dissolved gas volume. The relaxation times in the gas phase exhibit the following behavior:

$$T_1 = T_2 \propto \eta/kT (\text{methane vapor}) \quad (5)$$

The reason the relationship in Eq. (2) is not followed is that protons in the gas phase relax by spin-rotation and not by dipole-dipole interaction. Increasing the pressure on gas increases $T_1$, which is contrary to the behavior of fluids. For the gas signal to be detectable downhole, the bulk density and the hydrogen density must be relatively high, i.e. only the high-viscosity end of Eq. (5) is visible. Under these circumstances, methane relaxation times are in the range from hundreds of milliseconds to several seconds.

Dissolved gas has a profound effect on the $T_1$ of oil. See, Appel et al., 2000. Lo et al. (2000) have developed a mixing-rule model for methane-alkane mixtures that links GOR to $T_1$ and diffusivity. In this model, $T_1$ consists of two components: one proportional to $kT/\eta$ (Eq. 2) and one proportional to $\eta/kT$ (Eq. 5). The observed $T_1$ is a combination of the two, weighted by the proton fractions of the alkane and the methane gas.

Based on the discussion above, following are examples of measurements that can be made in accordance with the method of the present invention.

B. Relaxation Time Measurements

Figure 4:
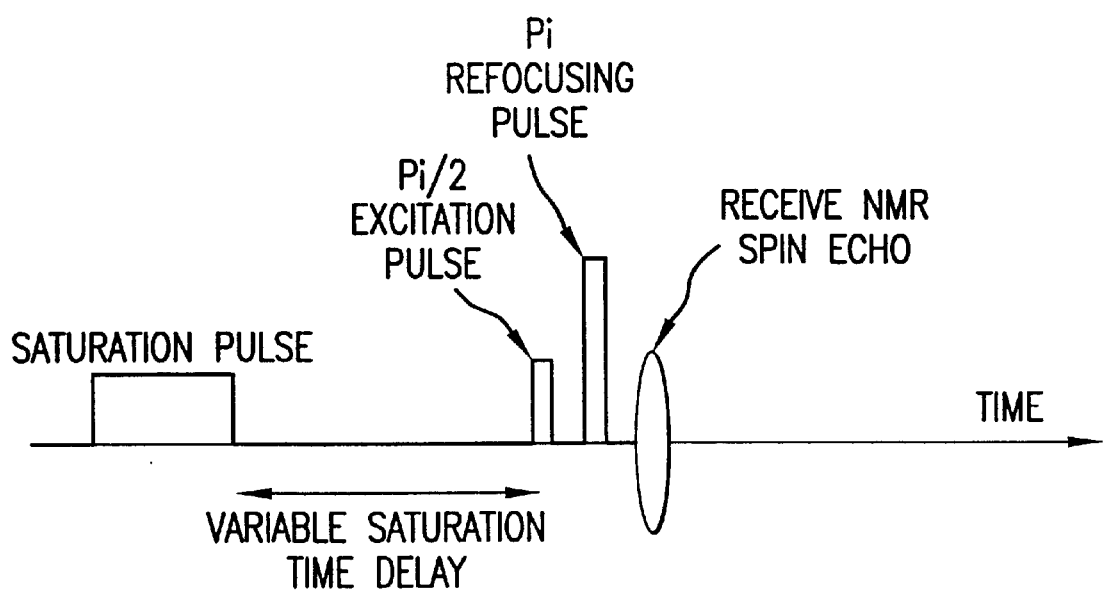
FIG. 4 illustrates a saturation-recovery pulse sequence diagram used for $T_1$ measurements in accordance with a preferred embodiment of the present invention.

In the apparatus of the present invention $T_1$ relaxation times and hydrogen density can be measured continuously whether or not the fluid is stagnant or flowing. This mode is most useful during the pump-out period to get an initial assessment of mud filtrate contamination. FIG. 4 illustrates the pulse sequence employed used in a preferred embodiment. It will be appreciated that it is a standard saturation-recovery sequence, where an initial saturation pulse is followed by a variable delay. In a preferred embodiment, the delay is programmable and is typically stepped through the values 1, 2, 4, 8, 16, . . . , 16384 ms in cyclical fashion. The recovered magnetization at the end of the delay is determined by a short read-out sequence, consisting of two pulses and one spin echo. The height of the echo, if plotted as function of delay time, traces out a recovery curve that is converted into a $T_1$ distribution by standard inversion methods. In one embodiment, the inversion algorithm is a variant of the method employed to calculate $T_2$ distributions from wireline data, as disclosed in U.S. Pat. No. 5,517,115. See also Prammer, 1994 reference. With the above sequence it takes 33 seconds to complete a measurement cycle. The signal-to-noise figure of the system is so high that additional averaging may be unnecessary. The sequence described above is insensitive to fluid flow and can be used to continuously monitor the $T_1$ profile of pumped fluids.

More specifically, the $T_1$ measurement sequence is initiated by a frequency-swept saturation pulse. With reference to FIG. 1, its frequency is selected such that the entire range of resonance frequencies within the sections (C) and (D) of the apparatus are affected. In a specific embodiment, this range is typically the NMR center frequency +/-1% (4.2 MHz+/-40 kHz). Pulse amplitude, frequency sweep rate and pulse length are adjusted to effect saturation in volumes (C) and (D).

As noted, following the saturation pulse, a variable delay is inserted. In a preferred embodiment, consecutive measurements with delay values of 1 ms, 2 ms, 4 ms, . . . up to 16384 ms are used. During these intervals, the nuclear magnetization builds up again to its equilibrium value. Also during this time, depending on the flow rate, fluid volume moves from volume (C) into volume (D), while unprepared fluid enters volume (C). As long as the flow rate is not high enough to allow unprepared fluid from (A) or (B) to enter (D), it will be appreciated that the measurement is independent of the actual flow rate. After the saturation-recovery delay, the instantaneous value of the nuclear magnetization is determined. This is done with a short pulse sequence, consisting of a $\pi/2$ pulse, followed by a $\pi$ pulse. The RF phase of these pulses is shifted by 90° against each other to cancel the effects of $B_0$ and RF field imperfections. This is equivalent to the start of a CPMG sequence. The time between these pulses is typically 0.125 ms and 0.125 ms after the $\pi$ pulse a spin echo forms. This echo is digitized, quantified and its amplitude is taken as a measure of the recovered magnetization as function of the saturation-recovery delay. Note that the $\pi/2$ and $\pi$ pulses can be narrow-band and need not be frequency-swept. The reason is that they are only relevant for section (D) which has a very tightly controlled field and resonance frequency distribution.

Figure 5A:
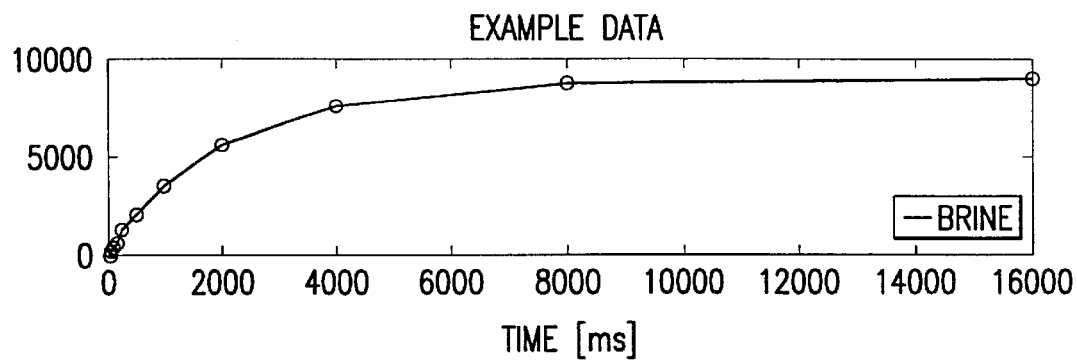
FIG. 5 illustrates examples of $T_1$ saturation-recovery data for three different fluids as seen in the NMR fluid analyzer in accordance with the present invention.
Figure 5B:
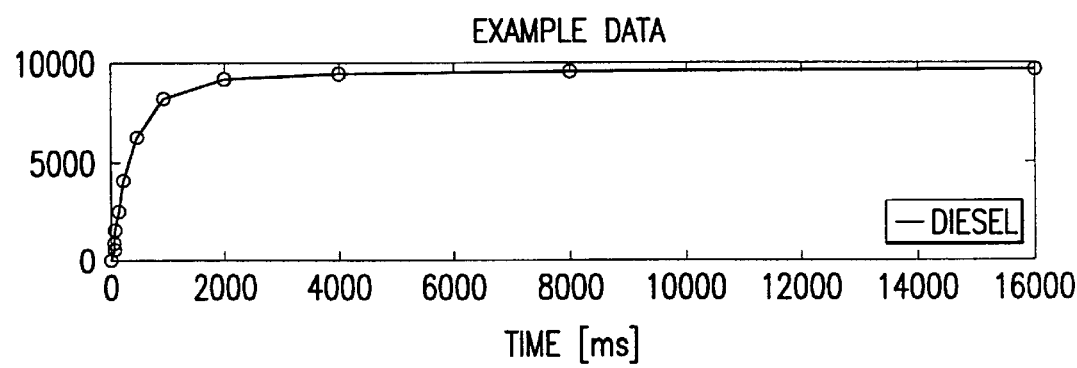
Figure 5C:
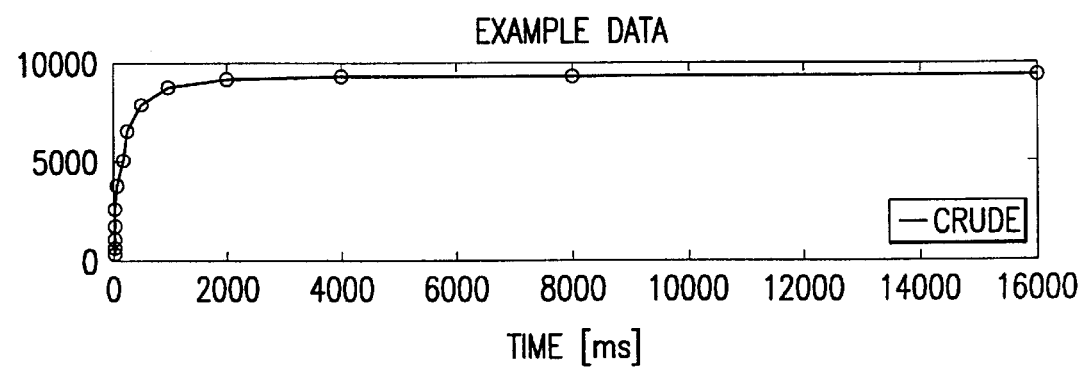
Figure 6A:
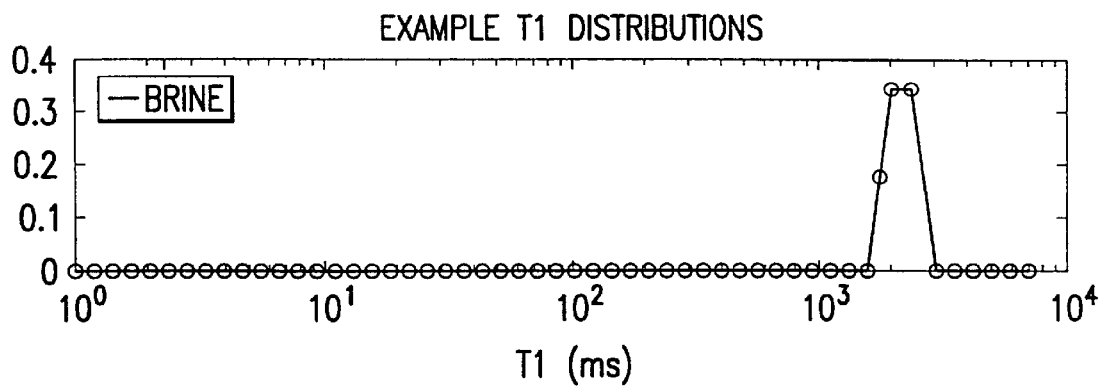
FIG. 6 illustrates the data shown in FIG. 5, but in the $T_1$ domain.
Figure 6B:
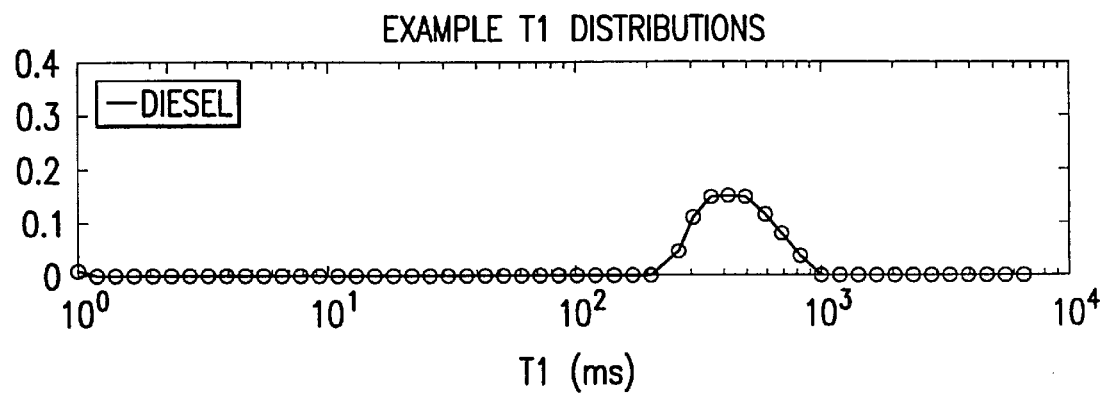
Figure 6C:
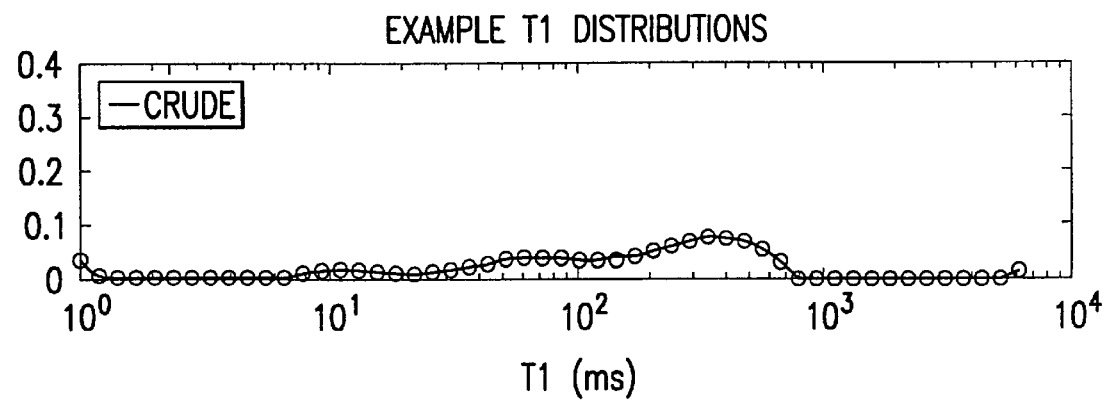

Examples for $T_1$ distributions for some example fluids obtained in accordance with the method of this invention are shown in FIGS. 5 and 6. The data points were acquired according to the sequence in FIG. 4 and inverted from the time domain to the $T_1$ domain. The horizontal axis, "time," in FIG. 5 denotes the time elapsed between the saturation pulse and the readout sequence, the vertical axis is signal amplitude in arbitrary units. The results are easier to interpret after inversion from time domain to T1 domain, as shown in FIG. 6. In this example 53 points are specified for the inversion result. The single, sharp peak at 2–3 s is characteristic of water, the rounded peak in the "oil window"

0.5–1 s indicates oil and the broad response from the crude oil in the bottom panel is characteristic for complex hydrocarbons. Shown in this figure here are examples of $T_1$ saturation-recovery data for three different fluids: brine, Diesel oil and a crude oil.

The data points illustrated have been acquired by circulating different fluids through the analyzer. Shown from top to bottom are: water (mild brine) with a single relaxation peak in the "water window" at 2 seconds; next a simple hydrocarbon (diesel) with a single relaxation peak in the "oil window" at 0.5–1 second; and a complex hydrocarbon (crude), which shows a characteristic asymmetric distribution that starts in the few tens of milliseconds and extends to the "oil window." These samples were under atmospheric conditions at ambient temperature. At elevated temperatures, Eq. (2) predicts an increase in $T_1$ proportional to the absolute temperature in addition to increases due to reduction in viscosity.

It is important to note that using the apparatus and method of the present invention the determination of long relaxation times does no longer depend on how long an echo train persists. In the implementation discussed above small perturbations in the applied field have relatively limited effect. Additionally, the saturation pulse prepares a much larger sample volume than what is actually used for the readout portion. Therefore, as long as the flow rate is low enough, and the readout is based on a fluid sample that was present anywhere within the regions (C) or (D) during the saturation pulse, the measurement is valid.

In contrast to $T_1$, the $T_2$ parameter generally cannot be determined on a flowing sample. Distributions of $T_2$ times are determined in accordance with the present invention by standard Carr-Purcell-Meiboom-Gill (CPMG) sequences on samples that have been stagnated momentarily. In a specific embodiment, stagnation is achieved by closing a valve below the analyzer apparatus and diverting the flow stream around the sample chamber. The time required for a $T_2$ measurement is almost entirely determined by the polarization time ("wait time") of about 15 seconds.

C. Hydrogen Density Measurements

The hydrogen density or the total number of hydrogen atoms within the measurement volume is a by-product of any $T_1$ or $T_2$ measurement. It can be represented as the area under any $T_1$ distribution and is typically normalized to the hydrogen density of a reference oil at measurement temperatures. At room temperature, the reference oil and water have the same hydrogen density. The reported number is the relative hydrogen index $I_H$ in the range 0–2, with accuracy around 1%.

Hydrogen density is automatically converted to hydrogen index $I_H$. The hydrogen index is hydrogen density relative to that of water at ambient conditions. Under the assumption that the oil contains only hydrogen and carbon atoms, the mass density $\rho_m$, the hydrogen index $I_H$, and the hydrogen-to-carbon ratio R are related as follows:

$$I_H = \rho_m 9R/(12+R) \tag{6}$$

See, for example, after Zhang et al., 1998. Since the hydrogen index is measured, either the mass density or the H:C ratio can be computed from an estimate of the other variable.

It has been reported that most saturated hydrocarbon liquids have relative hydrogen indices of 1 within +/−5%. The hydrogen density in gases is significantly lower due to the overall lower density. Thus, a depressed hydrogen index serves as a first-order alert to the presence of gas and a change in the relationship between $T_1$ and viscosity. Appel et al. (2000) reported a reduction of about 20% on live oil samples at 180° F. Under the assumption that all gas is methane ($CH_4$), the observed hydrogen index can be approximated as follows:

$$I_H = x(9/4\rho + (1-x)1, \tag{6A}$$

where x is the volumetric gas fraction ($m^3/m^3$) and $\rho$, in $g/cm^3$, is the density of methane. The density of methane follows from its temperature and pressure, and Eq. (6A) can be used to derive a first-order approximation for the gas fraction x.

D. Diffusion Measurements

Diffusion measurements in accordance with the present invention are implemented using steady-gradient spin-echo (SGSE) experiments. See, Kimmich et al., 1997. The experiment requires that the fluid flow be temporarily stopped. The idea of using the fringes of a uniform-field volume for diffusometry is derived from so-called SSF-SGSE methods. Its main advantage over pulsed-field gradient spin-echo (PFGSE) diffusometry is instrumental simplicity and superior stability. The main drawback is a limit on sensitivity, which, for the downhole implementation, is approximately $10^{-6}$ $cm^2/s$.

Figure 7:
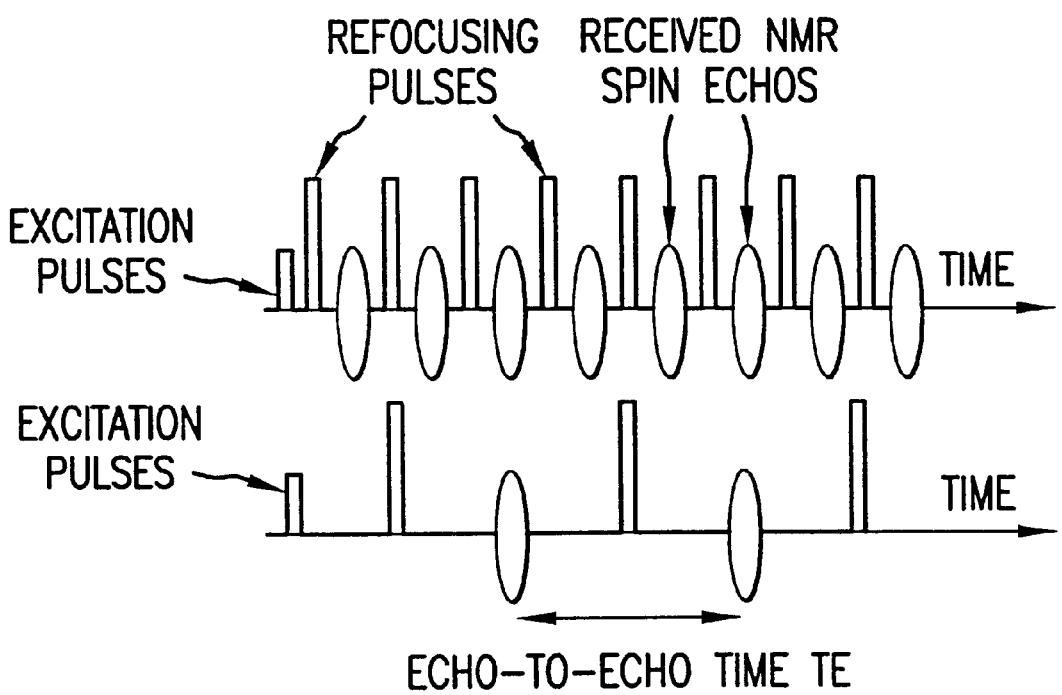
FIG. 7 illustrates a pulse sequence employed in accordance with a preferred embodiment for diffusivity measurements.

As noted above, the sensitive volume of the apparatus of this invention can be divided into an interior, homogeneous region and an exterior gradient region. The field in the fringe volume, which makes up about ⅓ of the total volume, can be approximated by a single field gradient value $G_0$. At short echo spacings (0.25 ms), the effect of the field gradient is too small to be relevant. The pulse sequence used both for diffusion measurements and for diffusivity calibration is shown in FIG. 7.

In particular, two Carr-Purcell-Meiboom-Gill (CPMG) sequences with a short echo spacing (typically 0.25 ms) and a long spacing ($T_e$) are alternated. The long echo spacing is selected as an integer multiple of the short spacing. In this case, echoes line up in time, i.e., occur at the same elapsed time since the excitation pulse and the ratio of their amplitudes can be formed.

Assuming that the fluid under investigation has a $T_2$ relaxation time, (the argument also holds for an arbitrary distribution of $T_2$ times) and diffusivity D, the two echo trains for the short and the long echo spacing can be described as follows:

$$A_1 = I_H \exp(-t/T_2) \text{ and}$$

$$A_2 = I_H K_0 \exp(-t/T_2)\exp(-t/T_D) + I_H(1-K_0)\exp(-t/T_2)$$

where $$1/T_D = 1/12(\gamma G_0 T_e)^2 D. \tag{7}$$

The system parameter $K_0$ is the gradient volume divided by the total volume. The hydrogen gyromagnetic ratio $\gamma$ is equal to 26,754 rad/s/gauss. Both $K_0$ and $G_0$ are temperature-dependent and are determined during calibration. The diffusivity D is derived from Eqs. 7 by taking the ratio of corresponding echoes, as follows:

$$A_2/A_1 = K_0 \exp(-t/T_D) + (1-K_0) \tag{8}$$

Figure 8A:
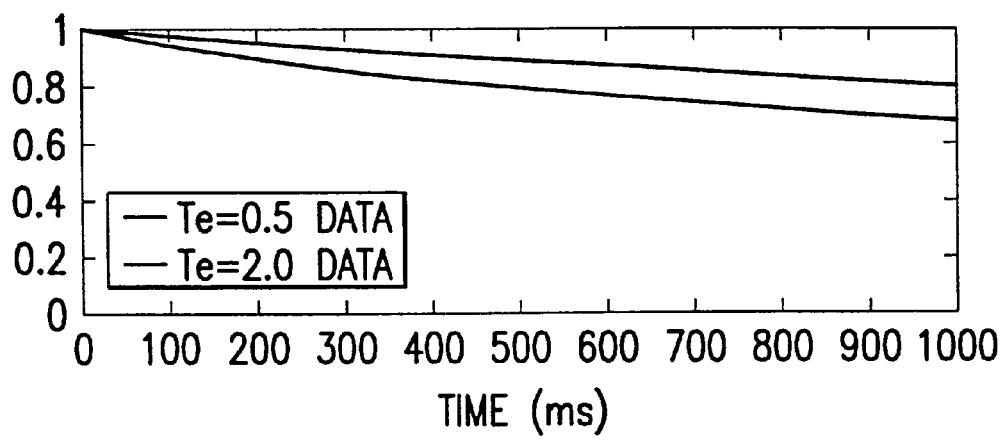
FIG. 8 is an example of a diffusivity measurement in accordance with the present invention.
Figure 8B:
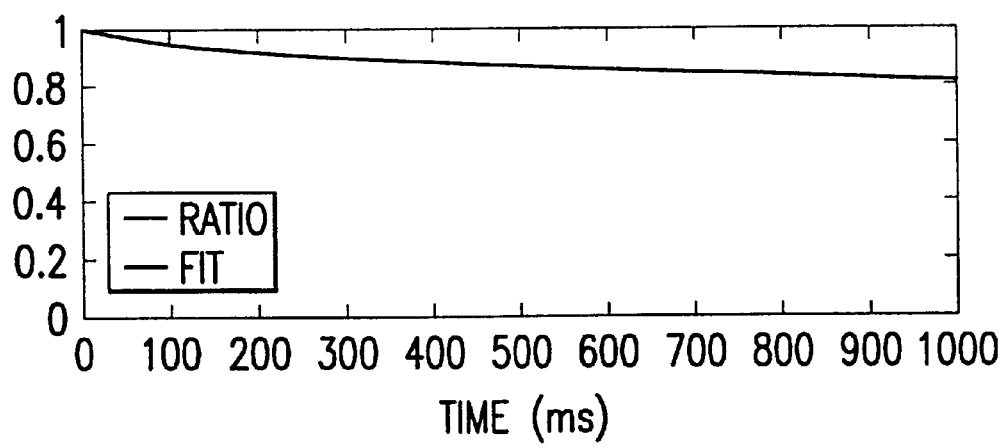

This curve is fit to a uni-exponential model plus an offset. In FIG. 8, the top two curves are the $A_1$ and $A_2$ signals for water at room temperature. Below is the ratio curve and the best-fit uni-exponential model. Since D for water is known as $2.5 \times 10^{-5}$ $cm^2/s$, these curves determine the calibration parameters $G_0$ and $K_0$.

The top two curves in FIG. 8 are spin echo amplitudes at different echo spacings. The accelerated decay for the longer spacing is a manifestation of diffusion in the gradient region of the magnetic field. The ratio curve (below) is the sum of an exponential and a constant term, corresponding to the gradient-field region and the uniform-field region, respectively. The best-fit model curve is also plotted and is not distinguishable from the data.

In a preferred embodiment, viscosity is determined as follows:

$$\eta = 5 \times 10^{-8} T/D \qquad (9)$$

In this expression, the viscosity $\eta$ is measured in cp, the temperature T in Kelvin and the diffusivity D in cm$^2$/s. The temperature may be obtained in a preferred embodiment from the RDT fluid temperature sensor. The proportionality factor has been determined by fitting Eq. (1) to data from pure alkanes and methane-alkane mixtures.

E. Calibration

In a preferred embodiment, the system performs its own calibration, provided the sample chamber is filled with a known reference fluid (typically oil) and the system is heated through its operating temperature range. At specific temperature points, the built-in processor system records the sensor's resonance frequency and amplitude response and stores the results in a permanent calibration table. After calibration, the hydrogen density is reported in percentage of that of the reference fluid, all times are in seconds and diffusivities are in cm$^2$/s.

Applications

Several practical applications are made possible by the apparatus and method of the present invention. Broadly, such applications relate to the measurement of relaxation distributions for the purpose of differentiation between reservoir hydrocarbons and oil-based mud (OBM) filtrates, as well as support for fluid-typing by wireline and LWD NMR tools. Other practical applications relate to calculation of hydrocarbon viscosity and gas-to-oil ratio and the modeling of fluid composition, as shown in the specific examples below.

One suitable method for the identification of different oils is described in detail in U.S. Pat. No. 6,107,796, which is incorporated herein for all purposes. The differentiation is based on differences in $T_2$ distributions, where crude oils typically exhibit more complex distributions and characteristically short relaxation times. Similar differentiation is possible based on $T_1$ relaxation measurements. It will be appreciated that in general $T_2$ relaxations are faster to measure and can be based on thousands of data points from a CPMG sequence. $T_1$ measurements are typically slower and yield few date points. However, as long as the underlying degrees of freedom in either distributions are not more than three-four, meaningful relaxation time distribution can be computed from about ten or more data points on a $T_1$ recovery curve. Examples of specific practical applications follow. ps Connate Oil v. Mud Filtrate Differentiation $T_1$ distributions can be used for qualitative fluid characterization of this type without invoking much of the relaxation theory. In a specific embodiment, the product $\eta T_1$ is set to 1 at T=300K and a simple viscosity scale is established from 1,000 cp to 1 cp, corresponding to the $T_1$ range 1 ms to 1,000 ms. See also FIG. 6. The water peak is distinctly offset due to the different molecular structure. The complexity of the distribution in the bottom panel of FIG. 6 is believed to reflect a distribution of internal mobilities due to a mix of short and long hydrocarbon chains. Contrast this appearance to the simple structure in the center panel in FIG. 6. This contrast provides a simple method to differentiate between complex oils (crudes) and simple oils (filtrates), that can be applied in a relatively straightforward manner using the techniques of the present invention.

NMR Log Interpretation

Both wireline and LWD tools take their readings in the invaded zone, which is more or less flushed by filtrates. Porosity measurements by NMR are in fact hydrogen density readings in the fluid phase, calibrated to a water sample and corrected for temperature. Consequently, a lower-than-anticipated hydrogen index (dissolved gas, etc.) may cause an undercall in porosity. Techniques are available to correct this effect for entrained methane, but it is more precise to sample the invaded zone and directly determine the hydrogen index of the produced fluid.

Fluid typing based on wireline/LWD NMR is complicated by the fact that $T_1$ and $T_2$ distributions are modulated by variations in pore sizes and by the bulk relaxation response of crude oils. The interpretation makes simplifying assumptions about the hydrocarbon phase (non-wetting, single $T_1$ for oil; single $T_1$ for gas). In accordance with the present invention this approach can be refined by determining the actual relaxation profiles from fluid samples and by feeding this information back into the saturation calculation.

Wireline and LWD NMR tools operate at frequencies between 0.5 MHz and 2 MHz, while the fluid analyzer described above operates at about 4 MHz. It will be appreciated that this difference is irrelevant for the relaxometry of fluids with $T_1 = T_2$. This condition indicates a uniform and flat energy spectrum in the employed frequency range.

Hydrocarbon Viscosity

Determination of viscosity under true reservoir conditions has always been a challenge. As noted above, the NMR-derived diffusivity D has a universal correlation with viscosity. In order to obtain a continuous viscosity reading, however, it is desirable to also derive a viscosity estimate from $T_1$ and $I_H$ alone. For the case of no dissolved hydrocarbon gas (i.e. $I_H$ close to 1) and no entrained paramagnetic oxygen, currently the best available correlation is:

$$T_1 = T_2 \approx 9.6 \ 10^{-3} T/\eta \text{(degassed alkanes)}, \qquad (11)$$

where $T_1$ and $T_2$ are in s, T is in K, and $\eta$ is in cp (See, Lo et al., 2000). To compute viscosity from a $T_1$ distribution, one can use the approximation:

$$\eta \approx 9.6 \ 10^{-3} T/T_1^{g.m} \qquad (12)$$

where $T_1^{g.m}$ is the geometric mean taken over the $T_1$ distribution. It is expected that this correlation can be improved by including the hydrogen index once a sufficient body of downhole NMR data becomes available.

Gas/Oil Ratio (GOR)

For dead oils (GOR=0), the relationship between $T_1$ and D is basically linear, as can be seen with reference to Eqs. (1) and (2). Increasing gas contents introduces a deviation from the linear behavior. Modification of Eq. 2 and substituting from Eq. 1 leads to:

$$T_1, T_2 \propto D/f(GOR), \qquad (13)$$

where f(GOR) is a function that has been determined empirically for methane-n-alkane mixtures. See Freedman et al., 2000. The proportionality factor in Eq. (13) is approximately $2 \times 10^5$ (Lo et al., 2000). Accordingly, the GOR can be determined graphically by means of a crossplot $T_1$ v. D with GOR as parameter, as shown in FIG. 13 of the Lo et al reference.

Emerging practical applications aim at a comprehensive understanding of the reservoir fluid system, the evaluation of which can be improved using the present invention.

Although the present invention has been described in connection with the preferred embodiments, it is not intended to be limited to the specific form set forth herein, but on the contrary, it is intended to cover such modifications, alternatives, and equivalents as can be reasonably included within the spirit and scope of the invention as defined by the following claims.

What is claimed is:

1. A method for analyzing formation fluids in a borehole environment, comprising the steps of:
    (a) introducing formation fluids in a flow-through vessel located in the borehole;
    (b) generating a substantially uniform static magnetic field in the vessel with a defined magnetic field direction;
    (c) generating pulsed oscillating magnetic fields for exciting nuclei of formation fluids in a first portion of the vessel, said oscillating fields having a magnetic direction substantially perpendicular to the direction of the static magnetic field;
    (d) receiving nuclear magnetic resonance (NMR) relaxation signals from excited nuclei of the fluid in a second portion of the vessel, smaller than the first portion; and
    (e) analyzing the received signals to determine fluid properties at any flow rate of the formation fluids in the vessel below a predetermined non-zero threshold.

2. The method of claim 1, wherein in step (c) the pulsed magnetic fields are according to a saturation recovery pulse sequence.

3. The method of claim 2, wherein an excitation pulse in step (c) excites nuclei in substantially the entire first portion of the vessel.

4. The method of claim 1, wherein the threshold value for the flow rate is determined by the length of the first portion.

5. The method of claim 1, wherein the second portion of the vessel is positioned downstream from the first portion of the vessel.

6. The method of claim 5, wherein the first and second portions of the vessel overlap at least in part.

7. The method of claim 1, wherein steps (a)–(d) are performed substantially continuously.

8. The method of claim 7, wherein the step of analyzing comprises assessing mud filtrate contamination for the formation fluids.

9. The method of claim 7, wherein the step of analyzing comprises monitoring the $T_1$ profile of fluids passed through the vessel.

10. The method of claim 1, wherein parameters of the pulsed oscillating magnetic fields are selected to effect saturation in the first and second portions of the vessel.

11. An apparatus for analyzing formation fluids in a borehole environment, comprising:
    (a) means for introducing formation fluids in a flow-through vessel located in the borehole;
    (b) means for generating a substantially uniform static magnetic field in the vessel with a defined magnetization direction;
    (c) means for generating pulsed oscillating magnetic fields for exciting nuclei of formation fluids in a first portion of the vessel, said oscillating fields having a magnetic direction substantially perpendicular to the direction of the static magnetic field;
    (d) means for receiving nuclear magnetic resonance (NMR) relaxation signals from excited nuclei of the fluid in a second portion of the vessel, smaller than the first portion; and
    (e) means for analyzing the received signals to determine fluid properties at any flow rate of the formation fluids in the vessel below a predetermined non-zero threshold.

12. The apparatus of claim 11, wherein the means for generating pulsed oscillating magnetic fields comprises means for generating a saturation recovery pulse sequence.

13. The apparatus of claim 11, wherein the second portion of the vessel is positioned downstream from the first portion of the vessel.

14. The apparatus of claim 13, wherein the first and second portions of the vessel overlap at least in part.

15. A tester module for use with modular downhole formation testers for downhole nuclear magnetic resonance (NMR) testing of formation fluids comprising:
    a vessel for providing flow-through passage of formation fluids and for conducting downhole NMR measurements, said vessel being adapted to withstand borehole environment conditions;
    at least one tubular magnet defining a longitudinal axis, the magnet having magnet sections with magnetization direction(s) perpendicular to the longitudinal axis, and enclosing the passage to generate therein a static magnetic field with predetermined magnetic field direction;
    at least one radio frequency (RF) transmitter operative to generate pulsed RF magnetic fields in a first portion of the passage in a direction substantially perpendicular to the static field direction for exciting nuclei of fluids in the passage;
    a receiver for acquiring NMR signals from excited nuclei in a second portion of the passage smaller than the first portion and positioned downstream therefrom, and
    a processor for analyzing properties of fluids in the passage based on signals from the receiver.

* * * * *

UNITED STATES PATENT AND TRADEMARK OFFICE
CERTIFICATE OF CORRECTION

PATENT NO. : 6,737,864 B2 Page 1 of 1
DATED : May 18, 2004
INVENTOR(S) : Prammer et al.

It is certified that error appears in the above-identified patent and that said Letters Patent is hereby corrected as shown below:

Title page,
Item [75], Inventors, should read:
-- Manfred G. Prammer, Downington, PA (US)
John C. Bouton, Doylestown, PA (US)
Peter Masak, West Chester, PA (US)
Earle D. Drack, Phoenxville, PA (US) --.

Signed and Sealed this

Twenty-fourth Day of January, 2006

JON W. DUDAS
*Director of the United States Patent and Trademark Office*

UNITED STATES PATENT AND TRADEMARK OFFICE
Certificate

Patent No. 6,737,864 B2  Patented: May 18, 2004

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Manfred G. Prammer, Downington, PA (US); John C. Bouton, Doylestown, PA (US); Peter Masak, West Chester, PA (US); Earle D. Drack, Phoenixville, PA (US); and Alexey A. Tyshko, Coatesville, PA (US).

Signed and Sealed this Thirteenth Day of September 2011.

MELISSA J. KOVAL
*Supervisory Patent Examiner*
Art Unit 2858
Technology Center 2800